United States Patent
Li (10) Patent No.: US 9,363,920 B1
(45) Date of Patent: Jun. 7, 2016

(54) SERVER

(71) Applicants: Inventec (Pudong) Technology Corporation, Shanghai (CN); INVENTEC CORPORATION, Taipei (TW)

(72) Inventor: Ming-Gang Li, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 29 days.

(21) Appl. No.: 14/596,951

(22) Filed: Jan. 14, 2015

(30) Foreign Application Priority Data

Dec. 3, 2014 (CN) .......................... 2014 1 0723473

(51) Int. Cl.
- *H05K 7/00* (2006.01)
- *H05K 7/14* (2006.01)
- *H05K 7/18* (2006.01)

(52) U.S. Cl.
CPC ................ *H05K 7/1489* (2013.01); *H05K 7/18* (2013.01)

(58) Field of Classification Search
USPC ............. 361/679.01, 679.02, 679.31, 679.33, 361/724–729, 756; 312/223.1, 223.2; 248/27.1, 27.3, 51–52, 201, 220.21, 248/220.41, 229.16, 229.26, 242, 298.1, 248/396, 419, 917, 918
See application file for complete search history.

(56) References Cited

U.S. PATENT DOCUMENTS

| | | | | |
|---|---|---|---|---|
| 6,773,080 B2 * | 8/2004 | Chen | ...................... | A47B 57/40 211/26 |
| 7,780,253 B1 * | 8/2010 | Lu | .......................... | H05K 7/183 211/26 |
| 7,934,607 B2 * | 5/2011 | Henderson | ........... | H05K 7/1489 211/175 |
| 8,602,372 B2 * | 12/2013 | Yu | ........................ | H05K 7/1489 211/192 |
| 8,727,138 B2 * | 5/2014 | Dittus | .................. | H05K 7/1489 211/26 |
| 8,864,190 B2 * | 10/2014 | Chang | .................. | H05K 7/1489 292/109 |
| 9,161,625 B2 * | 10/2015 | Chen | .................... | A47B 88/044 |

\* cited by examiner

*Primary Examiner* — Hung S Bui
(74) *Attorney, Agent, or Firm* — Locke Lord LLP; Tim Tingkang Xia, Esq.

(57) ABSTRACT

A server includes bracket and tray. The bracket is detachably installed on guiding rails of a case. The bracket includes two side frames and two synchronous plates. The two side frames is installed on the two guiding rails of the case which are facing each other, respectively. The synchronous plates having a limiting surface are slidably installed on the front parts of the two side frames, respectively. Each of the synchronous plates has a fixing position and a free position. The tray includes a body and two limiting bars which are installed on two sides of the body which are opposite to each other, respectively. The limiting bars face the synchronous plates, respectively. When the tray is pulled out of the case, the fixing bars are stopped by the limiting surfaces, respectively, so that the tray and the bracket are pulled out of the case together.

10 Claims, 11 Drawing Sheets

SERVER

CROSS-REFERENCE TO RELATED APPLICATIONS

This non-provisional application claims priority under 35 U.S.C. §119(a) on Patent Application No(s). 201410723473.4 filed in China on Dec. 3, 2014, the entire contents of which are hereby incorporated by reference.

BACKGROUND OF THE INVENTION

1. Technical Field of the Invention

The disclosure relates to a server, and more particularly to a server with a tray and a bracket.

2. Description of the Related Art

With the development of the internet technology, servers are widely used in many organizations. In a server rack, multiple servers are installed in a server case of the server rack. Hard disk drives and other modules of the server are installed on a tray of the server. A bracket is detachably installed in the case via guiding rails. The tray and the bracket are connected through the sliding rails. The sliding rails enable the tray to slide into or slide out of the accommodating space of the bracket. In this way, user can remove the tray from the accommodating space of the bracket so that the servers can be taken out of the case for maintenance and repair of the hard disk drives and other modules.

However, when the hard disk drives and other modules on the tray need to be overhauled, or when the bracket requires maintenance or replacement, a user have to remove the server from the case. To remove the server from the case, the user has to pull the tray out of the accommodating space of the bracket completely. Therefore, the sliding rails connecting the tray and the bracket have to bear the weight of the tray and the modules on the tray. When the total weight of the tray and the modules is too heavy, it may cause the deformation of the sliding rails. In addition, it takes more time to remove the bracket from the case because the server has to be pulled out of the accommodating space of the bracket completely before pulling the bracket out of the case.

SUMMARY OF THE INVENTION

The disclosure provides a server with a tray and a bracket to solve problems about detaching the server from a case and damages and deformations of the server caused by detaching.

An embodiment of the disclosure provides a server, for being installed on two guiding rails of a case, comprises a bracket and a tray. The bracket is detachably installed on the guiding rails of the case. The bracket comprises two side frames and two synchronous plates. The side frames are detachably installed on the guiding rails of the case, respectively. The side frames are opposite to each other. Each of the side frames comprises a front part with a first fixing hole. Each of the synchronous plates comprises a second fixing hole and a limiting surface. The synchronous plates are slidably installed on the front parts, respectively. Each of the synchronous plates has a fixing position and a free position. The first fixing hole is aligned with the second fixing hole when the synchronous plate is at the fixing position. The first fixing hole is misaligned with the second fixing hole when the synchronous plate is at the free position. The tray detachably installed on the bracket. The tray comprises a body and two limiting bars. The body has two front ends facing the front parts which are opposite to each other, respectively. The limiting bars are installed on two sides of the body that are opposite to each other and facing the synchronous plates of the bracket, respectively. When the tray and the bracket are pushed into the case along the guiding rails together, the limiting bars cross the limiting surfaces so that the synchronous plates are moved from the free positions to the fixing positions, respectively. The synchronous plates face the front ends of the tray, respectively, and fixed at two holes at the front ends of the case by two fixing components, respectively. The fixing components cross the first fixing holes, the second fixing holes and the holes, respectively. When the fixing components are removed from the first fixing holes, the second fixing holes and the holes, respectively, and the tray is pulled out of the case, the synchronous plates are moved from the fixing positions to the free positions to stop the limiting bars by the limiting surfaces, respectively, so that the tray and the bracket are pulled out of the case together.

According to an embodiment of the disclosure, each of the side frames of the bracket has a guiding bar. Each of the synchronous plates further has a guiding groove. The guiding bar is located inside the guiding groove. When the synchronous plates are moved from the fixing positions to the free positions relative to the side frames, respectively, the guiding bars are moved along a first direction within the guiding grooves so that the first fixing holes aligned with the second fixing holes are moved to be misaligned with the second fixing holes, respectively. When the synchronous plates are moved from the free positions to the fixing positions relative to the side frames, respectively, the guiding bars are moved along a second direction within the guiding grooves so that the first fixing holes misaligned with the second fixing holes are moved to be aligned with the second fixing holes, respectively.

According to an embodiment of the disclosure, the tray is for sliding relative to the bracket along a sliding direction. Extending directions of the guiding grooves are perpendicular to the sliding direction.

According to an embodiment of the disclosure, the bracket further comprises two sliding rails. The sliding rails are disposed on the side frames, respectively. The tray further comprises two sliding components. The sliding components are located on two sides of the tray which are opposite to each other, respectively. The sliding components match with the sliding rails, respectively, so that the tray are slidably installed on the bracket.

According to an embodiment of the disclosure, each of the synchronous plates further comprises a bottom edge and a limiting groove. The limiting groove is recessed inward from the bottom edge. The limiting surface forms a wall of the limiting groove. The tray is for being ejected out of the case along a pulling direction. A normal direction of the limiting surface is opposite to the pulling direction.

According to an embodiment of the disclosure, each of the limiting grooves further comprises a first guiding inclination surface and a bottom surface. The first guiding inclination surface connects the bottom edge and the bottom surface. The bottom surface connects the first guiding inclination surface and the limiting surface. An obtuse angle is formed between the first guiding inclination surface and the bottom surface. The limiting surface is perpendicular to the bottom surface.

According to an embodiment of the disclosure, each of the synchronous plates further has a second guiding inclination surface connected to the limiting surface. An acute angle is formed between the second guiding inclination surface and the limiting surface.

According to an embodiment of the disclosure, when the synchronous plates are at the fixing positions, respectively, the limiting bars are pressed against the bottom edges of the synchronous plates so that the first fixing holes are aligned with the second fixing holes, respectively.

According to an embodiment of the disclosure, when the synchronous plates are at the free positions, respectively, the limiting bars are stopped by the limiting surfaces of the synchronous plates so that the first fixing holes are misaligned with the second fixing holes, respectively.

According to an embodiment of the disclosure, the guiding rails are L-shaped guiding rails. The guiding rails are installed on two sides of the case that are opposite to each other.

According to the server of the disclosure, when the tray is moved out of the case, the limiting bars of the tray and the limiting surfaces of the synchronous plates on the bracket are pressed against each other, respectively. As a result, the bracket and the tray are moved and pulled out of the case, synchronously. Therefore, the sliding rails do not bear the weight of the tray and other modules on the tray so that the deformation problems of the sliding rails are avoid. In addition, the server of the embodiments of the disclosure also reduces the detachment time of the server.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
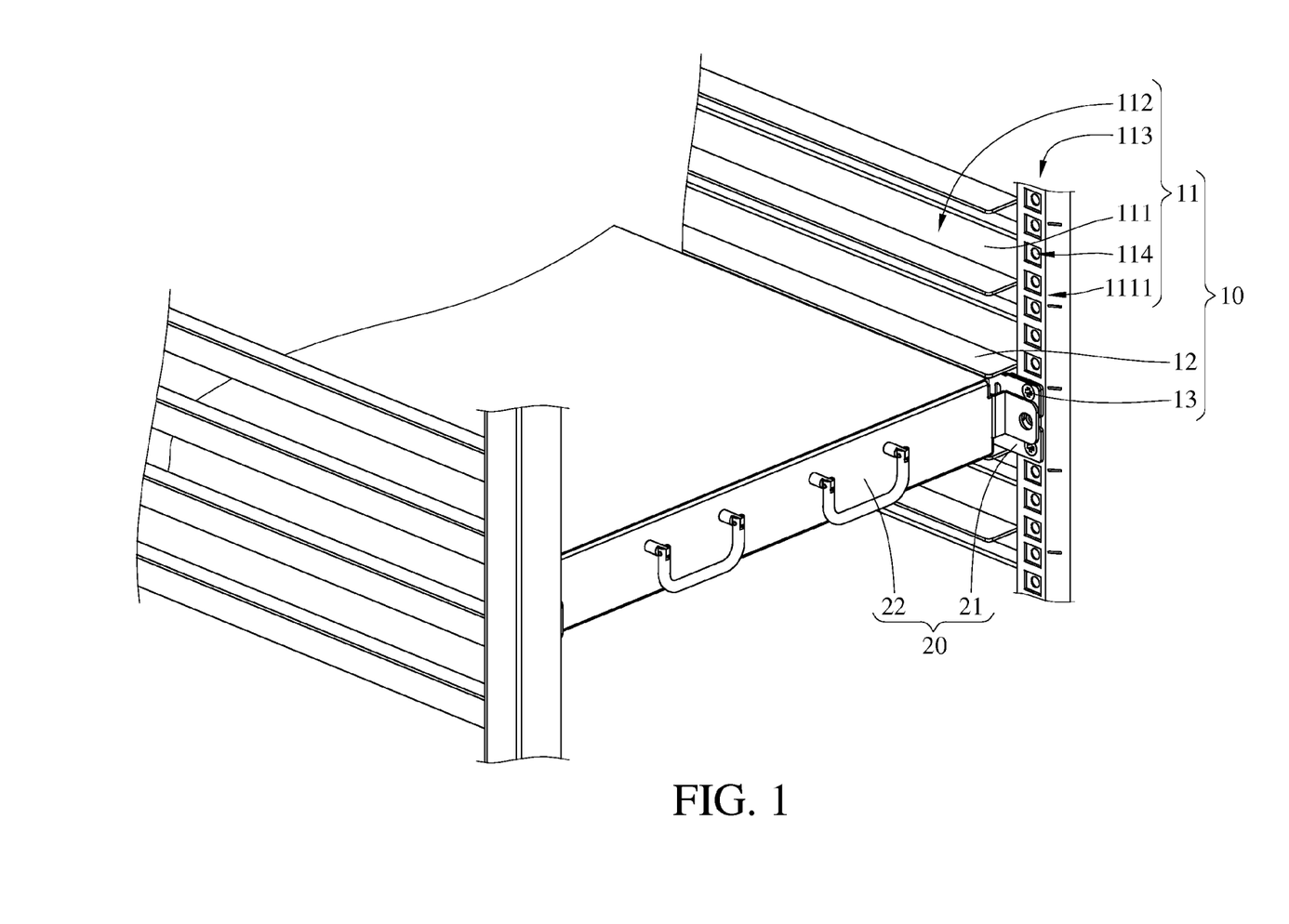
FIG. 1 is a schematic perspective view of a server according to an embodiment of the disclosure.
Figure 2:
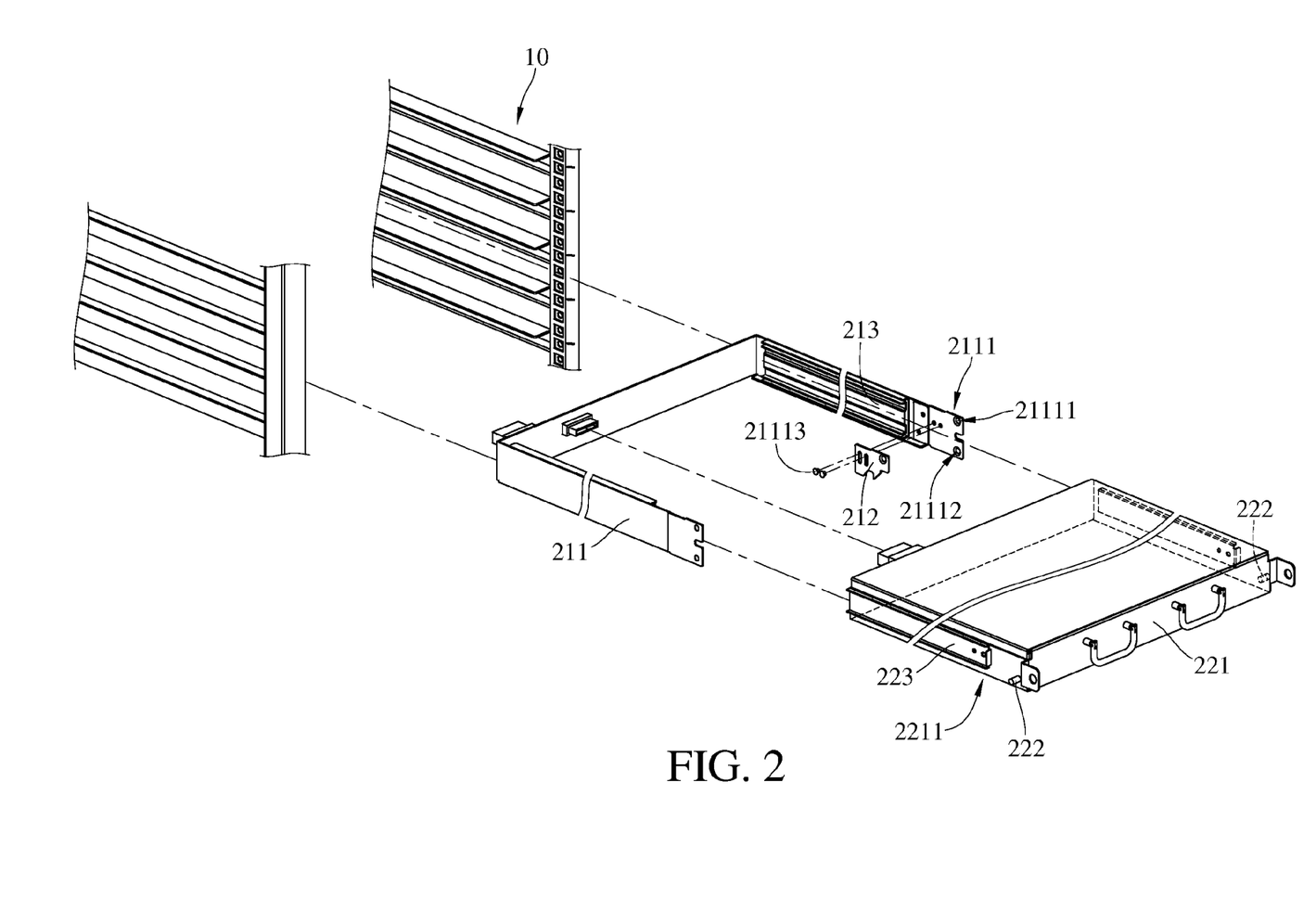
FIG. 2 is an exploded view of the server according to the embodiment of the disclosure.
Figure 3:
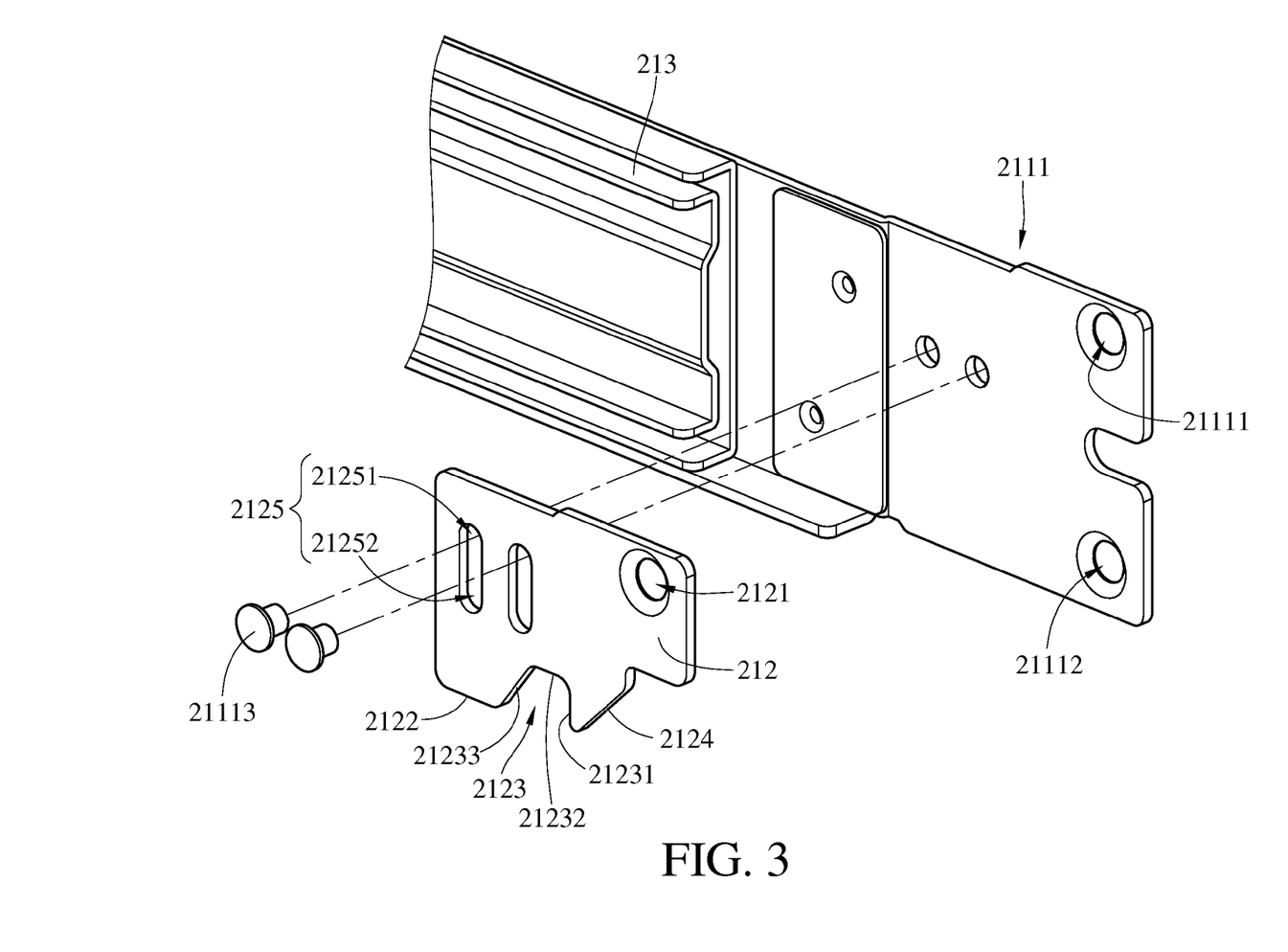
FIG. 3 is an exploded view of a bracket of the server according to the embodiment of the disclosure.

Please refer to FIG. 1 to FIG. 3, FIG. 1 is a schematic perspective view of a server according to an embodiment of the disclosure. FIG. 2 is an exploded view of the server according to the embodiment of the disclosure. FIG. 3 is an exploded view of a bracket of the server according to the embodiment of the disclosure. In the embodiment, a server 20 is detachably installed inside of a case 10. The case 10 comprises a case body 11, a plurality of guiding rails and a plurality of fixing components 13. The case body 11 has two inner wall surfaces 111, an accommodating space 112, an opening 113 and a plurality of holes 114. Two inner wall surfaces 111 of the case body 11 are opposite to each other and facing each other. Two inner wall surfaces 111 form an accommodating space 112 and an opening 113. The opening 113 is an access of the accommodating space 112. The plurality of the guiding rails 112 are arranged at intervals (i.e., by a distance) and secured at the inner wall surface 111, respectively. The server 20 is pushed into the accommodating space 112 of the case body 11 through the opening 113 and the front ends 1111 of the inner wall surfaces 111. The movement of the server 20 is along the guiding rails 112 which are facing each other on the inner wall surfaces 111. The plurality of holes 114 is located at the front ends 1111 of the inner wall surfaces 111 for fixing with the plurality of fixing components 13. The guiding rails 12 are L-shaped guiding rails in the embodiment. However, the disclosure is not limited to the shape of the guiding rails. In other embodiments, the guiding rails can have different shapes.

The server 20 comprises a bracket 21 and a tray 22. The tray 22 is detachably and slidably installed on the bracket 21. The bracket 21 comprises two side frames 211, two synchronous plates 212 and two sliding rails 213. The side frames 211 are detachably installed on the guiding rails 12 on the inner wall surfaces 111 of the case body 11, respectively. The sliding rails 213 are installed on the side frames 211 and facing each other. The extending direction of the sliding rails 213 are parallel to a direction that the server 20 is pushed into or pulled out of the accommodating space 112 of the case body 11 along the guiding rails 12.

Each of the front parts 2111 of the side frames 211 which is near the opening 113 has a first fixing hole 21111, a securing hole 21112 and at least one guiding bar 21113. The guiding bars 21113 are installed on the front parts 2111 of the side frames 211 and facing each other. In the embodiment, the number of the guiding bars on each of the front parts 2111 of the side frame s 211 is two. However, the disclosure is not limited to the number of the guiding bar. In other embodiments, the number of the guiding bar can be one or more than two.

Each of the synchronous plates 212 comprises a second fixing hole 2121, a bottom edge 2122, a limiting groove 2123, a second guiding inclination surface 2124 and at least one guiding groove 2125. The limiting groove 2123 is recessed inward from the bottom edge 2122 toward the center of the synchronous plate 212. Two ends of the limiting groove 2123 that are opposite to each other are connected to the bottom edge 2122 and the second guiding inclination surface 2124, respectively. The limiting groove 2123 comprises a limiting surface 21231, a bottom surface 21232 and a first guiding inclination surface 21233. In other words, the limiting surface 21231, the bottom surface 21232 and the first guiding inclination surface 21233 form walls of the limiting groove 2123. The server 20 can be ejected out of the case 10 along the guiding rails 12 along a pulling direction. A normal direction of the limiting surface 21231 is opposite to the pulling direction. The first guiding inclination surface 21233 connects the bottom edge 2122 and the bottom surface 21232. An obtuse angle is formed between the first guiding inclination surface 21233 and the bottom surface 21232. The bottom surface 21232 connects the first guiding inclination surface 21233 and the limiting surface 21231. The limiting surface 21231 is perpendicular to the bottom surface 21232. The second guiding inclination surface 2124 is connected to the limiting surface 21231. An acute angle is formed between the second guiding inclination surface 2124 and the limiting surface 21231. However, the disclosure is not limited to the angle formed between the limiting surface and the bottom surface.

In other embodiment of the disclosure, the angle formed between the limiting surface and the bottom surface is smaller than 90 degrees.

The number of the guiding groove 2125 of each of the synchronous plates 212 matches the number of the guiding bar 21113 located at each of the front parts 2111 of the side frames 211. Each of the guiding bars 21113 of the side frames 211 is located inside each of the guiding grooves 2125 of the synchronous plates 212, respectively, so that the synchronous plates 212 are slidably installed on the front parts 2111 of the side frames 211 relative to the side frames 211, respectively. The tray 22 is able to slide relative to the bracket 21 along a sliding direction. The sliding direction is also the direction that the server 20 is pushed into or pulled out of the accommodating space 112 of the case body 11 along the guiding rails 12. An extending direction of each of the guiding grooves 2125 is perpendicular to the sliding direction. Each of the guiding grooves 2125 has a top section 21251 and a bottom section 21252 that are connected with each other. The top section 21251 is at a side of the guiding groove 2125 that is farther away from the direction of the gravity than the bottom section 21252. In other words, the bottom section 21252 is at a side of the guiding groove 2125 that is closer to the direction of the gravity. Therefore, the sliding directions of the synchronous plates relative to the side frames 211 are perpendicular to the sliding direction that the server 20 is pushed into or pulled out of the accommodating space 112 of the case body 11 along the guiding rails 12. In the embodiment, the number of the guiding grooves of the synchronous plate is two. However, the disclosure is not limited to the number of the guiding grooves of the synchronous plate. In other embodiment, the number of guiding grooves of a synchronous plate is one or more than two.

Moreover, each of the synchronous plates 212 has a fixing position and a free position on the front part 2111 of the side frame 211. When the synchronous plate 212 is at the fixing position, the guiding bars 21113 are located at the bottom sections 21252 of the guiding grooves 2125, respectively, and the first fixing hole 21111 is aligned with the second fixing hole 2121. At this time, the fixing component 13 is able to cross the first fixing hole 21111 and the second fixing hole 2121 which are aligned with each other so that the synchronous plate 212 is fixed at the fixing position and the side frame 211 is fixed in the accommodating space 112 of the case body 11. In contrast, when the synchronous plate 212 is at the free position, the guiding bars 21113 are located at the top sections 21251 of the guiding grooves 2125, respectively, and the first fixing hole 21111 is misaligned with (i.e., does not communicate with) the second fixing hole 2121. At this time, both the first fixing hole 21111 and the second fixing hole 2121 are not constrained by the fixing component 13. Hence, the synchronous plate 212 is able to slide relative to the side frame 211, and the side frame 211 is able to slide relative to the case body 11 along the guiding rail 12.

The tray 22 comprises a body 221, two limiting bars 222 and two sliding components 223. The body 221 has two sides which are opposite to each other. When the tray is located in the accommodating space 112, two sides of the body 221 which are opposite to each other have two front ends 2211 near the opening 113, respectively. The limiting bars 222 are located at the front ends 2211 of the body 221 and extending toward the synchronous plates 212 of the bracket 21, respectively. The sliding components 223 are located at the sides of the body 221, respectively. The extending directions of the sliding components 223 are parallel to the direction that the server 20 is pushed into or pulled out of the accommodating space 112 of the case body 11 along the guiding rails 12. The sliding components 223 match the sliding rails 213, respectively, so that the tray 22 is slidably installed on the side frames 211 of the bracket 21.

Figure 7:
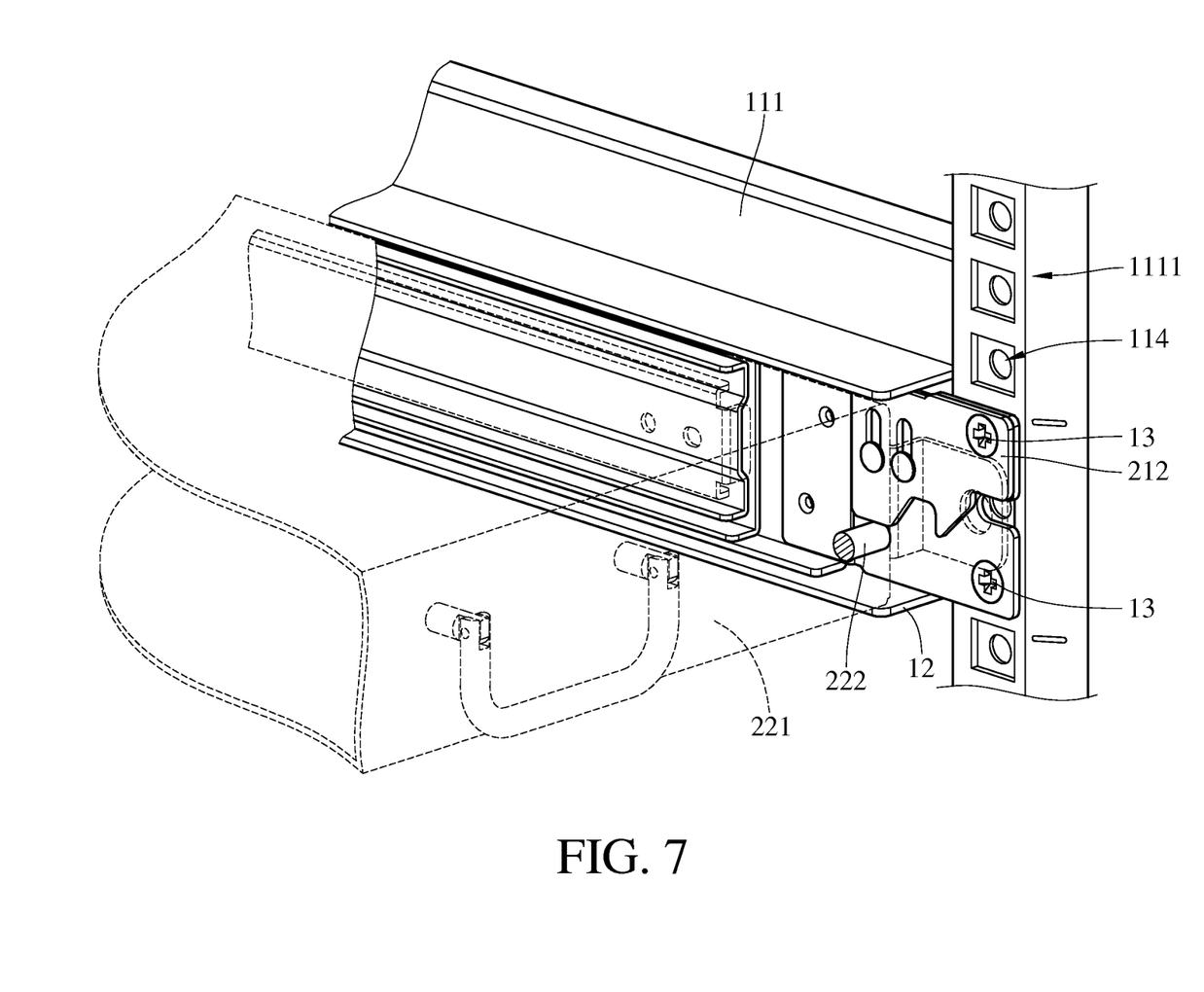
FIG. 7 is a schematic perspective view of a synchronous plate at a fixing position during assembly according to the embodiment of the disclosure.

The following describes the operations of the case 10 and the server 20 during the assembly of the server 20. Please referring to FIG. 1 to FIG. 7, FIG. 4 to FIG. 6 are cross-sectional views of the server during assembly according to the embodiment of the disclosure. FIG. 7 is a schematic perspective view of a synchronous plate at a fixing position during assembly according to the embodiment of the disclosure. Since components on the left side and the right side of the case 10 and the server 20 are symmetry with each other, the following describes the operations of the components on only one side of the case 10 and the server 20, and the operations on the other side of the case 10 and the server 20 will not be repeated hereinafter.

Figure 4:
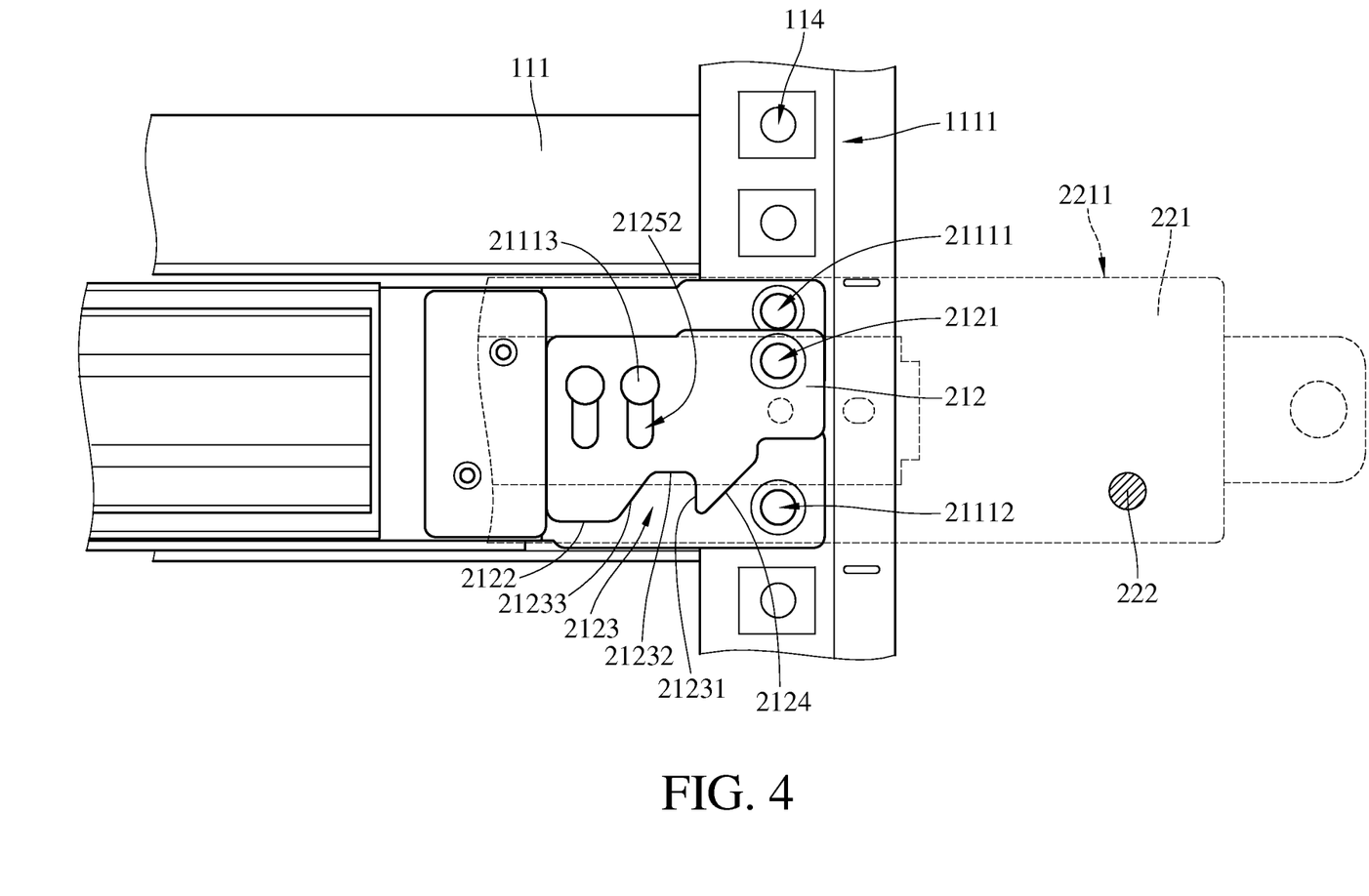
FIG. 4 to FIG. 6 are cross-sectional views of the server during assembly according to the embodiment of the disclosure.

Referring now to FIG. 1, FIG. 3 and FIG. 4, when the server 20 is assembled into the case 10, first, the bracket 21 is pushed into the accommodating space 112 through the opening 113 along the guiding rail 112 of the case 10. At this time, the synchronous plate 212 at the front part 2111 of the side frame 211 is at the free position due to the gravity. The guiding bars 21113 are located in the top sections 21251 of the guiding grooves 2125, respectively. The first fixing hole 21111 and the second fixing hole 2121 are misaligned.

Figure 5:
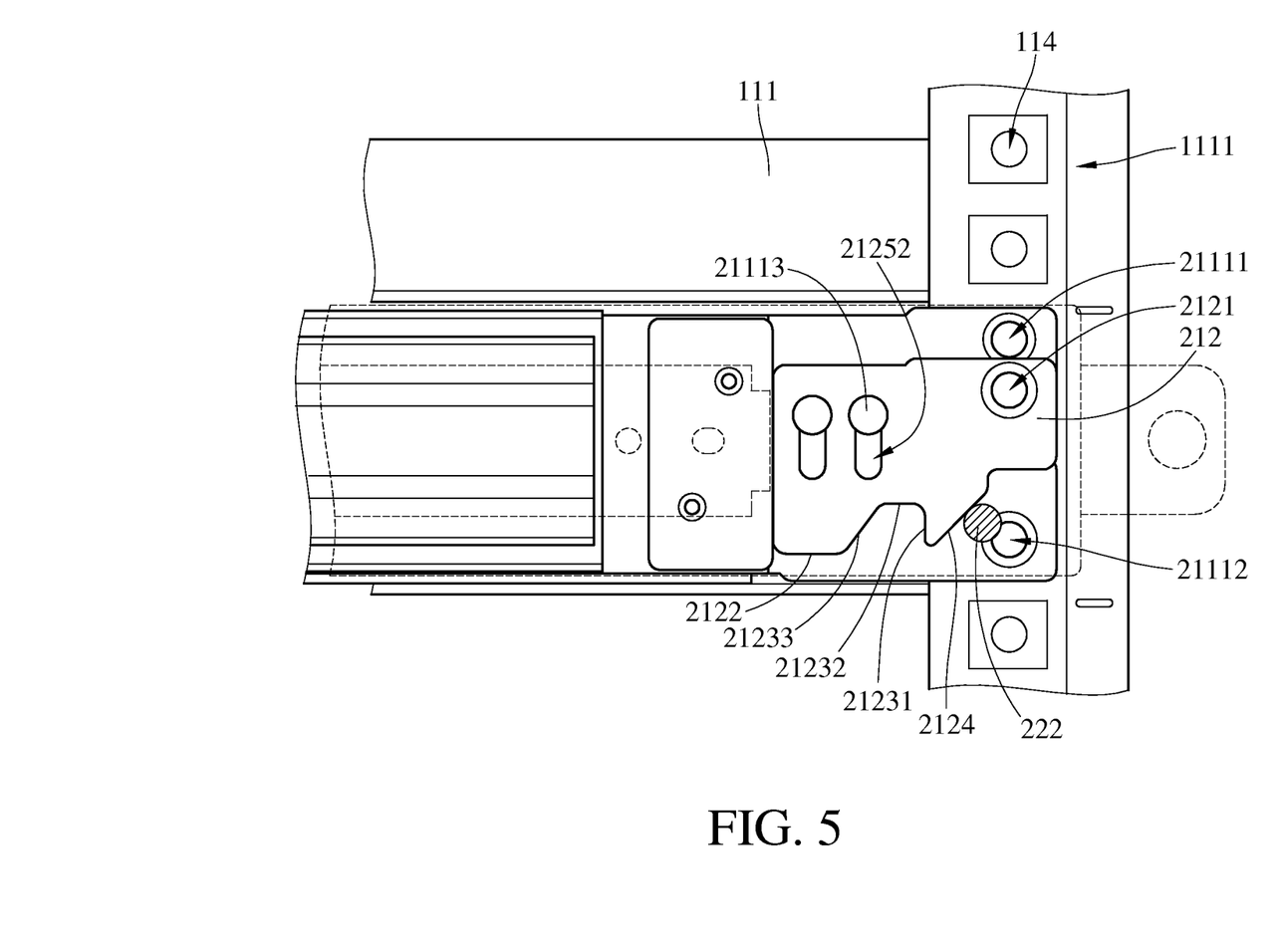
Figure 6:
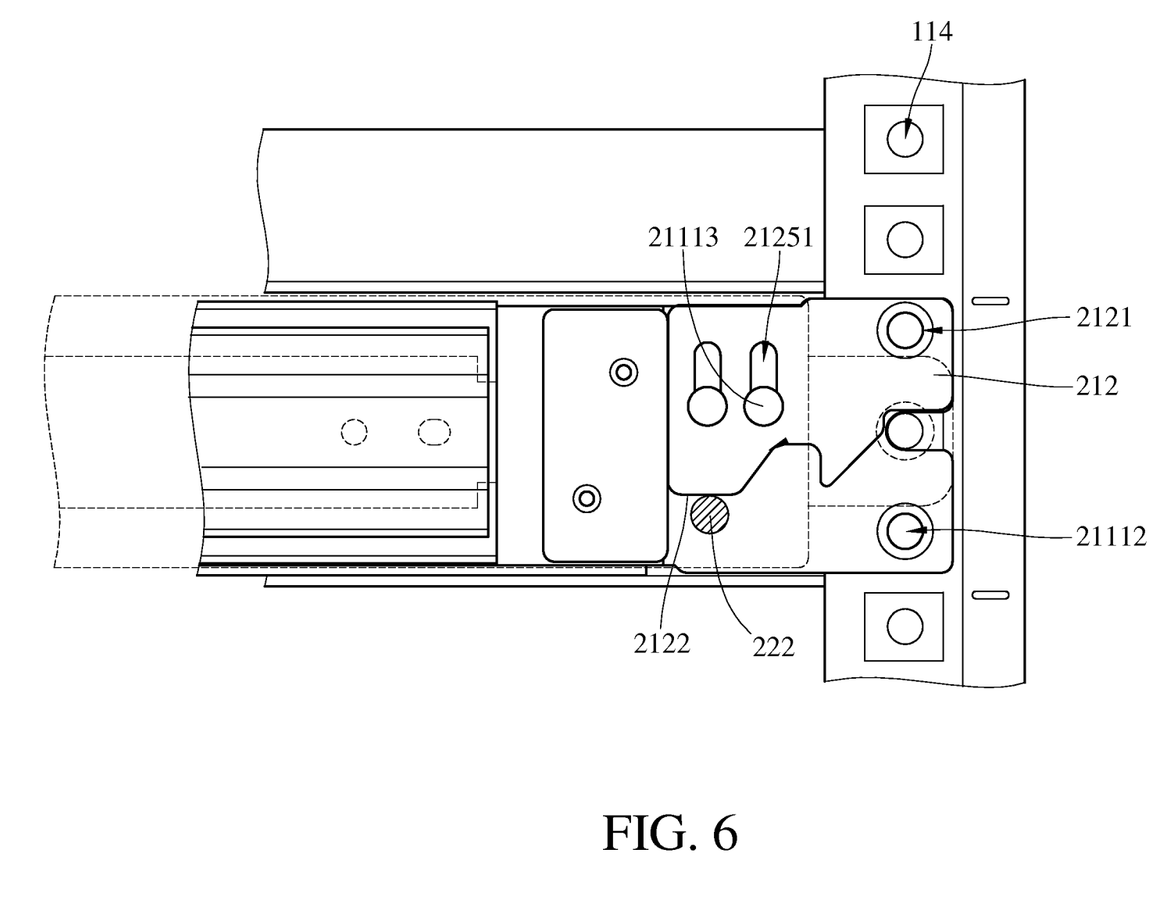

Referring now to FIG. 1, FIG. 2 and FIG. 5, next, the sliding rail 213 and the sliding component 223 are matched to push the tray 22 into the space between the side frames 211 which are inside the accommodating space 112. When the tray 22 is pushed to move into the accommodating space 112, the limiting bar 222 contacts the second guiding inclination surface 2124 and presses against the second guiding inclination surface 2124, the bottom surface 21232, the first guiding inclination surface 21233 and the bottom edge 2122 of the synchronous plate 212, sequentially.

Referring now to FIG. 1, and FIG. 5, when the tray 22 is completely pushed into the accommodating space 112, the limiting bar 222 presses against the bottom edge 2122 of the synchronous plate 212 so that the synchronous plate 212 moves along the direction opposite to the gravity to the fixing position. At this time, the guiding bars 21113 are located in the bottom sections 21252 of the guiding grooves 2125, respectively. The first fixing hole 21111 and the second fixing hole 2121 are aligned.

Referring now to FIG. 1, FIG. 3 and FIG. 7, then, the fixing component 13 penetrates through the first fixing hole 21111 and the second fixing hole 2121 which are aligned, and the fixing component 13 is secured in the hole 114 on the front end 1111 of the inner wall surface 111 so that the synchronous plate 212 is fixed at the fixing position and the side frame 211 is fixed in the accommodating space 112 of the case body 11. As a result, the bracket 21 is fixed at the case body 11. The tray 22 is able to slide relative to the bracket 21 with the assistance of the sliding rail 213 and the sliding component 223 which are matched with each other. In addition, one more fixing component 13 penetrates through a securing hole 21112 and secured in another hole 114 on the front end 1111 of the inner wall surface 111 to increase fixing strength applied on the side frame 211. However, the disclosure is not limited to the number of fixing component for fixing. In other embodiment, the number of fixing component for fixing is one or more than two.

Figure 11:
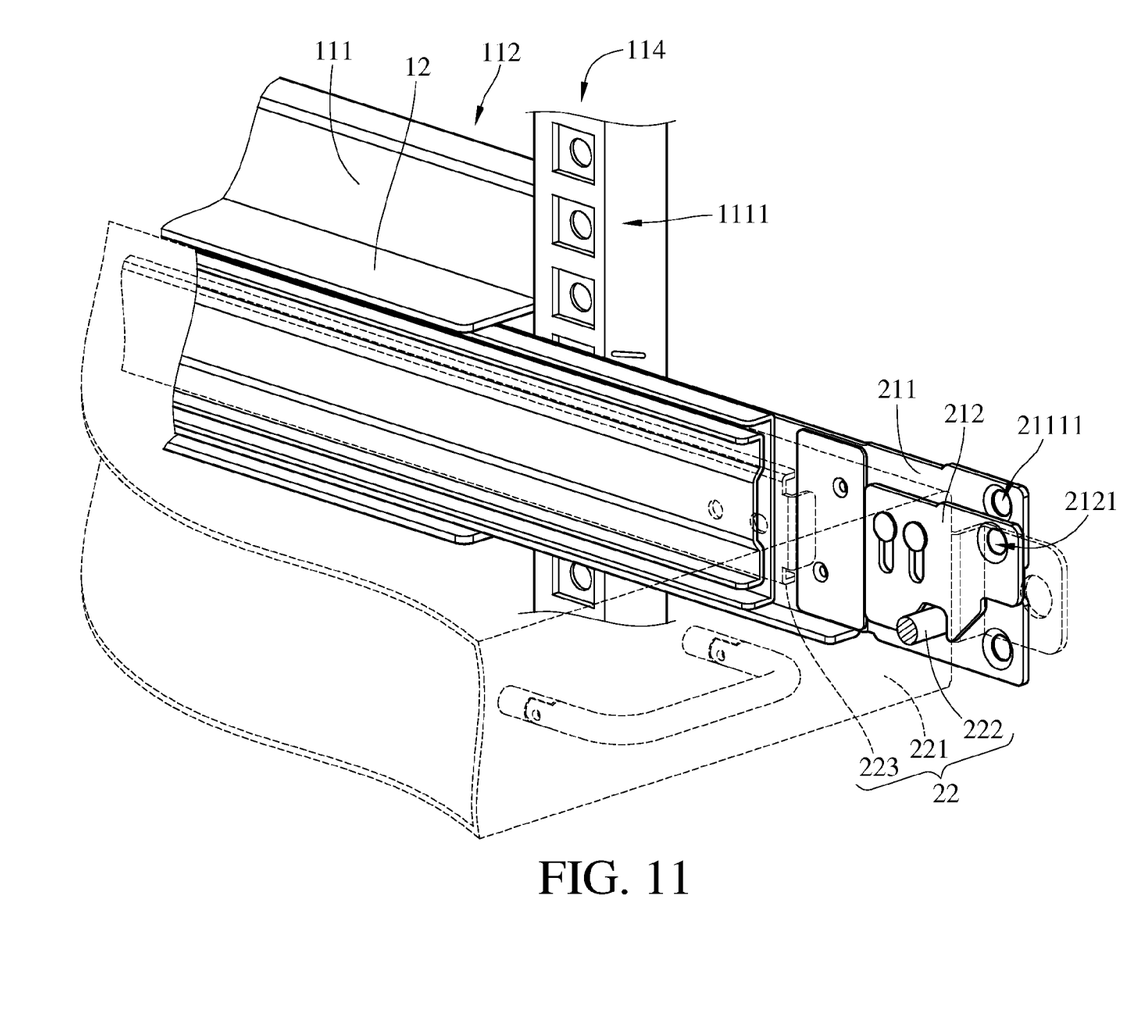
FIG. 11 is a schematic perspective view of a synchronous plate at a free position during detachment according to the embodiment of the disclosure.

The following are descriptions of the operations of the case 10 and the server 20 when detaching the server 20. Please referring to FIG. 1 to FIG. 3 and FIG. 8 to FIG. 11, FIG. 8 to FIG. 10 are cross-sectional views of the server during detachment according to the embodiment of the disclosure. FIG. 11 is a schematic perspective view of a synchronous plate at a free position during detachment according to the embodiment of the disclosure. Since components on the left side and the right side of the case 10 and the server 20 are symmetry with each other, the operations of the components on only one side of the case 10 and the server 20 will be illustrated, and the operations of the components on another side of the case 10 and the server 20 will not be repeated.

When the server 20 is detached from the case 10, first, all of the fixing components 13 on the server 20 are removed. Therefore, the fixation between the synchronous plate 212 and the side frame 211 and the fixation between the side frame 211 and the case body 11 are eliminated.

Figure 8:
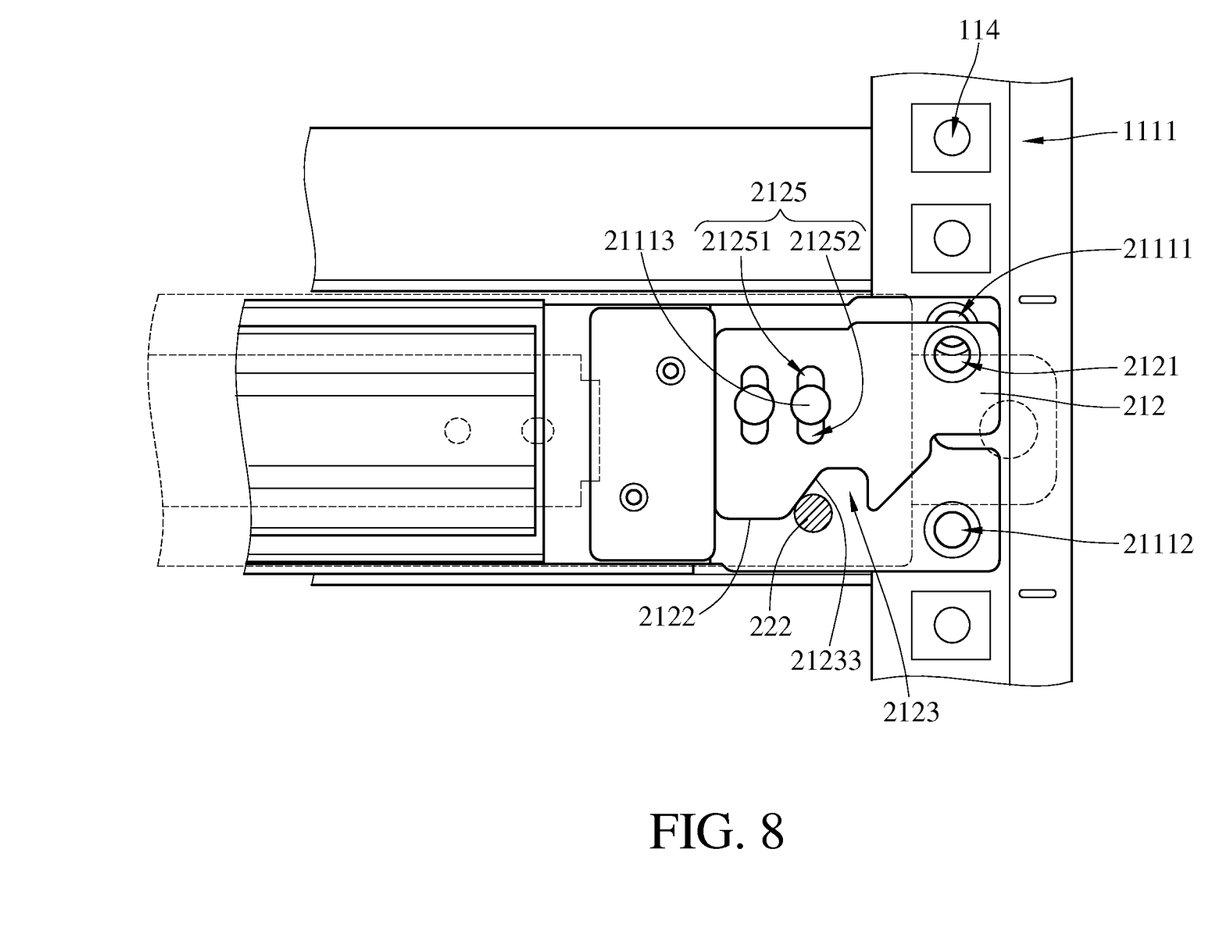
FIG. 8 to FIG. 10 are cross-sectional views of the server during detachment according to the embodiment of the disclosure.
Figure 9:
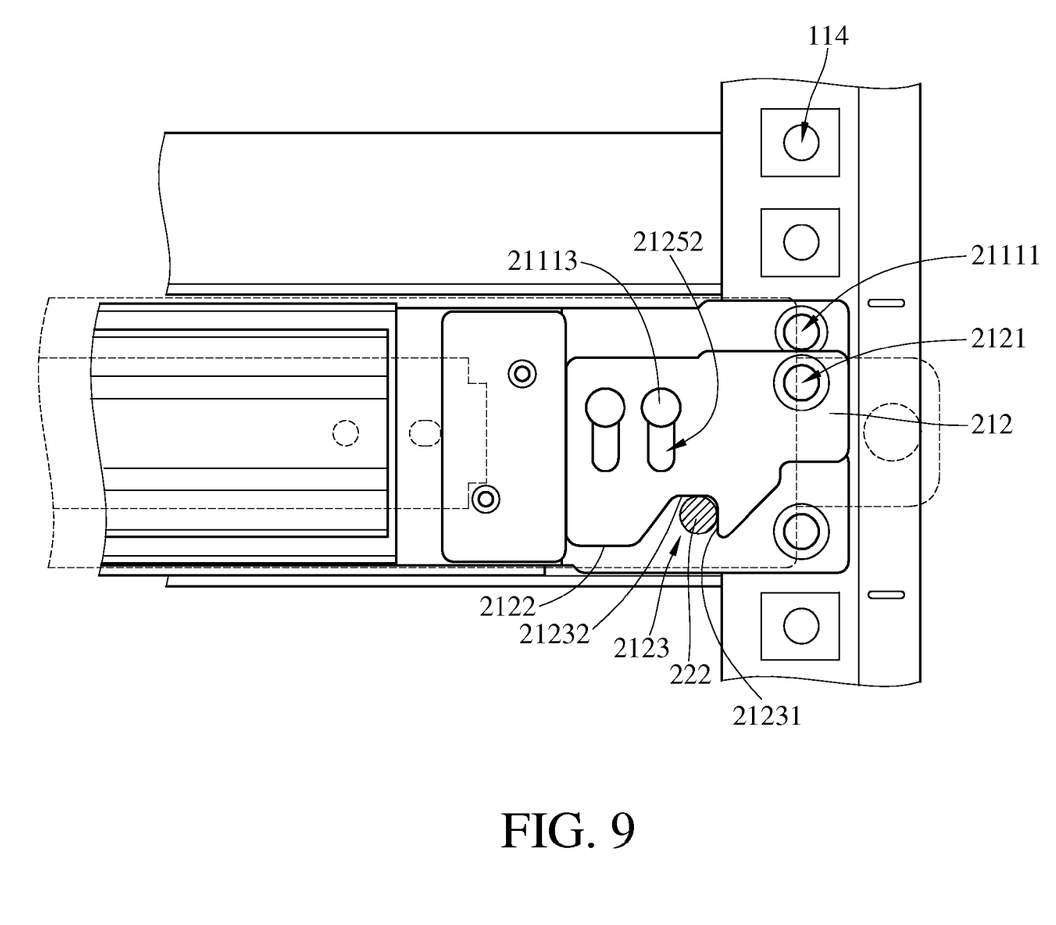
Figure 10:
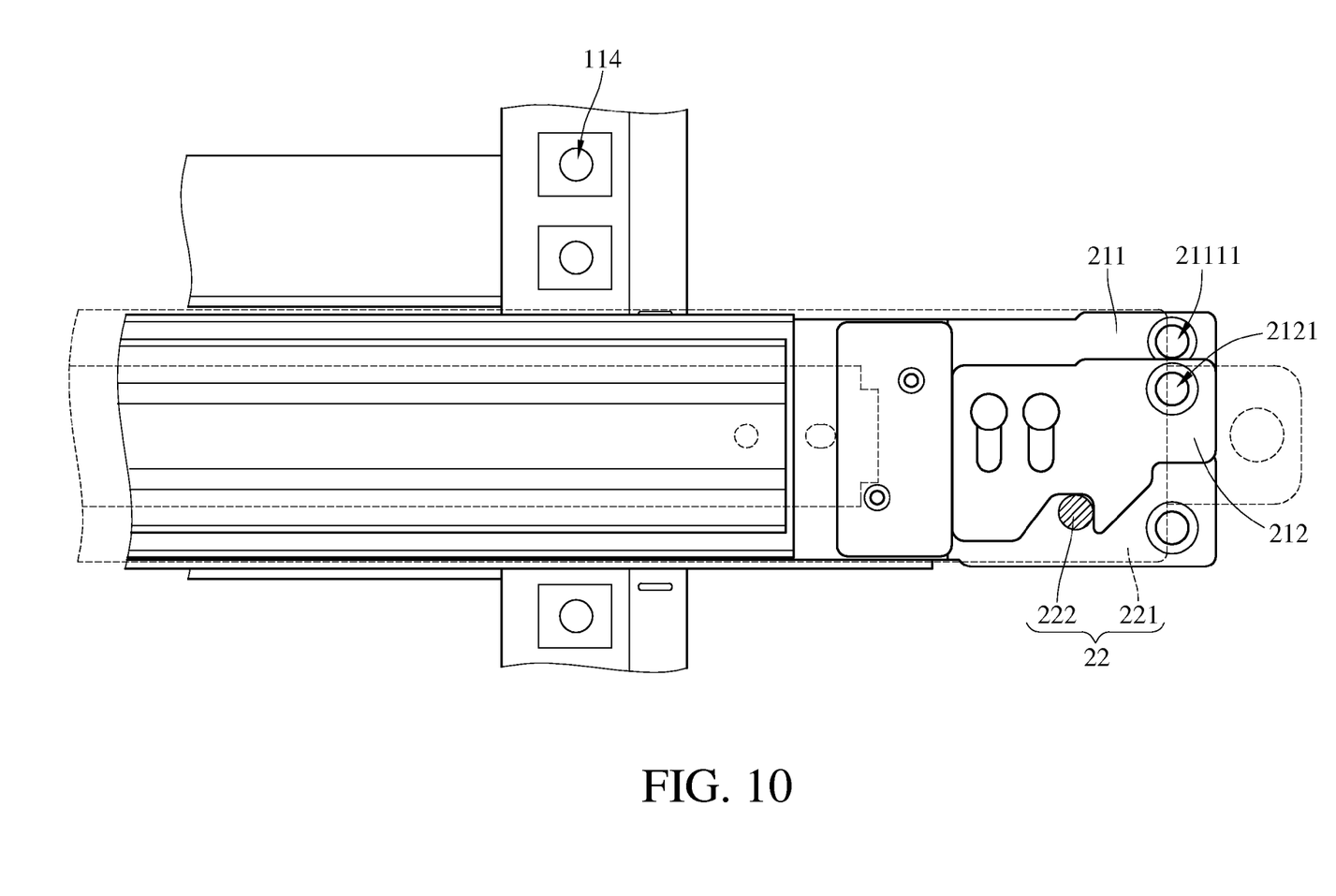

Referring now to FIG. 1, FIG. 8 and FIG. 9, next, the tray 22 is pulled out along a direction from the accommodating space 112 toward the opening 113. Since the tray 22 is pulled to move out of the accommodating space 112 and the synchronous plate 212 is dropped due to the gravity, the limiting bar 222 presses against the bottom edge 2122, the first guiding inclination surface 21233, the bottom surface 21232 and the limiting surface 21231, sequentially. The normal direction of the limiting surface 21231 is opposite to the pulling direction of the tray, and the limiting surface 21231 and the bottom surface 21232 are perpendicular with each other. Therefore, the limiting surface 21231 stops the movement of the limiting bar 222 and restrain the limiting bar 222 in the limiting groove 2123.

Referring now to FIG. 1, FIG. 9 to FIG. 11, next, the tray 22 is pulled out along a direction from the accommodating space 112 toward the opening 113, continuously. Because the limiting surface 21231 stops the limiting bar 222 and restrains the limiting bar 222 in the limiting groove 2123, no relative movement between the tray 22 and the bracket 21 along the direction from the accommodating space 112 toward the opening 113. As a result, the bracket 21 is driven by the tray 22 and pulled out from the accommodating space 112 along the guiding rails 12, synchronously, so that the server 20 and the case 10 are separated from each other.

According to the server of the embodiments of the disclosure, when the tray is moved out of the case, the limiting bars of the tray and the limiting surfaces of the synchronous plates on the bracket are pressed against each other, respectively. As a result, the bracket and the tray are moved and pulled out of the case, synchronously. Therefore, the sliding rails do not bear the weight of the tray and other modules on the tray so that the deformation problems of the sliding rails are avoid. In addition, the server of the embodiments of the disclosure also reduces the detachment time of the server.

What is claimed is:

1. A server, for being installed on two guiding rails of a case, comprising:
   a bracket detachably installed on the guiding rails of the case, the bracket comprising:
   two side frames detachably installed on the guiding rails of the case, respectively, the side frames being opposite to each other, and each of the side frames comprising a front part with a first fixing hole; and
   two synchronous plates, each of the synchronous plates comprising a second fixing hole and a limiting surface, the synchronous plates being slidably installed on the front parts, respectively, each of the synchronous plates having a fixing position and a free position, the first fixing hole being aligned with the second fixing hole when the synchronous plate is at the fixing position, the first fixing hole being misaligned with the second fixing hole when the synchronous plate is at the free position; and
   a tray detachably installed on the bracket, the tray comprising a body and two limiting bars, the body having two front ends facing the front parts which are opposite to each other, respectively, the limiting bars being installed on two sides of the body that are opposite to each other and facing the synchronous plates of the bracket, respectively;
   wherein, when the tray and the bracket are pushed into the case along the guiding rails together, the limiting bars cross the limiting surfaces so that the synchronous plates move from the free positions to the fixing positions, respectively, the synchronous plates are facing the front ends of the tray, respectively, and fixed at two holes at the front ends of the case by two fixing components, respectively, the fixing components cross the first fixing holes, the second fixing holes and the holes, respectively, when the fixing components are removed from the first fixing holes, the second fixing holes and the holes, respectively, and the tray being pulled out of the case, the synchronous plates move from the fixing positions to the free positions to stop the limiting bars by the limiting surfaces, respectively, so that the tray and the bracket are pulled out of the case together.

2. The server of claim 1, wherein each of the side frames of the bracket has a guiding bar, each of the synchronous plates further has a guiding groove, the guiding bar is located inside the guiding groove, when the synchronous plates are moved from the fixing positions to the free positions relative to the side frames, respectively, the guiding bars are moved along a first direction within the guiding grooves so that the first fixing holes aligned with the second fixing holes are moved to be misaligned with the second fixing holes, respectively, when the synchronous plates are moved from the free positions to the fixing positions relative to the side frames, respectively, the guiding bars are moved along a second direction within the guiding grooves so that the first fixing holes misaligned with the second fixing holes are moved to be aligned with the second fixing holes, respectively.

3. The server of claim 2, wherein the tray is for sliding relative to the bracket along a sliding direction, and extending directions of the guiding grooves are perpendicular to the sliding direction.

4. The server of claim 1, wherein the bracket further comprises two sliding rails, the sliding rails are disposed on the side frames, respectively, the tray further comprises two sliding components, the sliding components are located on two sides of the tray which are opposite to each other, respectively, the sliding components match with the sliding rails, respectively, so that the tray are slidably installed on the bracket.

5. The server of claim 1, wherein each of the synchronous plates further comprises a bottom edge and a limiting groove, the limiting groove is recessed inward from the bottom edge, the limiting surface forms a wall of the limiting groove, the tray is for being ejected out of the case along a pulling direction, and a normal direction of the limiting surface is opposite to the pulling direction.

6. The server of claim 5, wherein each of the limiting grooves further comprises a first guiding inclination surface and a bottom surface, the first guiding inclination surface connects the bottom edge and the bottom surface, the bottom surface connects the first guiding inclination surface and the limiting surface, an obtuse angle is formed between the first guiding inclination surface and the bottom surface, and the limiting surface is perpendicular to the bottom surface.

7. The server of claim 5, wherein each of the synchronous plates further has a second guiding inclination surface connected to the limiting surface, and an acute angle is formed between the second guiding inclination surface and the limiting surface.

8. The server of claim 5, wherein when the synchronous plates are at the fixing positions, respectively, the limiting bars are pressed against the bottom edges of the synchronous plates so that the first fixing holes are aligned with the second fixing holes, respectively.

9. The server of claim 5, wherein when the synchronous plates are at the free positions, respectively, the limiting bars are stopped by the limiting surfaces of the synchronous plates so that the first fixing holes are misaligned with the second fixing holes, respectively.

10. The server of claim 1, wherein the guiding rails are L-shaped guiding rails, and the guiding rails are installed on two sides of the case that are opposite to each other.

* * * * *